United States Patent
Niu et al.

(10) Patent No.: US 11,374,169 B2
(45) Date of Patent: Jun. 28, 2022

(54) MAGNETIC RANDOM ACCESS MEMORY

(71) Applicant: TAIWAN SEMICONDUCTOR MANUFACTURING CO., LTD., Hsinchu (TW)

(72) Inventors: Baohua Niu, Portland, OR (US); Ji-Feng Ying, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 56 days.

(21) Appl. No.: 16/939,613

(22) Filed: Jul. 27, 2020

(65) Prior Publication Data
US 2020/0357986 A1    Nov. 12, 2020

Related U.S. Application Data

(62) Division of application No. 15/906,901, filed on Feb. 27, 2018, now Pat. No. 10,727,401.
(Continued)

(51) Int. Cl.
| | |
|---|---|
| H01L 43/10 | (2006.01) |
| G11C 11/16 | (2006.01) |
| H01L 43/08 | (2006.01) |
| H01L 43/12 | (2006.01) |
| H01L 27/22 | (2006.01) |
| H01L 21/62 | (2006.01) |

(52) U.S. Cl.
CPC ............ *H01L 43/10* (2013.01); *G11C 11/161* (2013.01); *H01L 21/62* (2013.01); *H01L 27/22* (2013.01); *H01L 27/222* (2013.01); *H01L 43/08* (2013.01); *H01L 43/12* (2013.01); *G11C 11/1673* (2013.01); *H01L 27/228* (2013.01)

(58) Field of Classification Search
None
See application file for complete search history.

(56) References Cited

U.S. PATENT DOCUMENTS

| | | |
|---|---|---|
| 6,653,704 B1 | 11/2003 | Gurney et al. |
| 2001/0007793 A1 | 7/2001 | Vaartstra |

(Continued)

FOREIGN PATENT DOCUMENTS

| | | |
|---|---|---|
| DE | 102015216011 A1 | 3/2016 |
| DE | 102016117034 A1 | 7/2017 |

(Continued)

OTHER PUBLICATIONS

Notice of Allowance issued in related U.S. Appl. No. 15/906,901, dated Mar. 25, 2020.
(Continued)

*Primary Examiner* — Long Pham
(74) *Attorney, Agent, or Firm* — McDermott Will & Emery LLP

(57) ABSTRACT

A memory cell of a magnetic random access memory includes multiple layers disposed between a first metal layer and a second metal layer. At least one of the multiple layers include one selected from the group consisting of an iridium layer, a bilayer structure of an iridium layer and an iridium oxide layer, an iridium-titanium nitride layer, a bilayer structure of an iridium layer and a tantalum layer, and a binary alloy layer of iridium and tantalum.

20 Claims, 11 Drawing Sheets

Related U.S. Application Data

(60) Provisional application No. 62/584,529, filed on Nov. 10, 2017.

(56) References Cited

U.S. PATENT DOCUMENTS

| | | |
|---|---|---|
| 2002/0146902 A1 | 10/2002 | Vaartstra |
| 2002/0197744 A1 | 12/2002 | Lee |
| 2004/0150027 A1 | 8/2004 | Lee |
| 2005/0006685 A1 | 1/2005 | Natsume et al. |
| 2005/0087788 A1 | 4/2005 | Kutsunai et al. |
| 2005/0282295 A1 | 12/2005 | Raberg |
| 2007/0171694 A1 | 7/2007 | Huai et al. |
| 2009/0080123 A1 | 3/2009 | Uehara et al. |
| 2012/0309190 A1 | 12/2012 | Kelly et al. |
| 2015/0029779 A1 | 1/2015 | Lee et al. |
| 2015/0076635 A1 | 3/2015 | Daibou et al. |
| 2015/0259787 A1 | 9/2015 | Shim et al. |
| 2016/0211440 A1 | 7/2016 | Siddik et al. |
| 2019/0043548 A1* | 2/2019 | Park ................ H01L 43/10 |

FOREIGN PATENT DOCUMENTS

| | | |
|---|---|---|
| KR | 10-2008-0078079 A | 8/2008 |
| KR | 10-2017-0093546 A | 8/2017 |
| KR | 10-2017-0107000 A | 9/2017 |

OTHER PUBLICATIONS

Final Office Action issued in related U.S. Appl. No. 15/906,901, dated Dec. 19, 2019.

Non-Final Office Action issued in related U.S. Appl. No. 15/906,901, dated Jul. 3, 2019.

* cited by examiner

MAGNETIC RANDOM ACCESS MEMORY

RELATED APPLICATION

This application is a Divisional of U.S. patent application Ser. No. 15/906,901 filed Feb. 27, 2018, which claims priority to U.S. Provisional Application No. 62/584,529 filed on Nov. 10, 2017, the entire contents of which are incorporated herein by reference.

TECHNICAL FIELD

The present disclosure relates to a magnetic random access memory (MRAM) device and, more particularly, to a magnetic RAM device based on a magnetic tunnel junction cell formed with a semiconductor device.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

DETAILED DESCRIPTION

Figure 1A:
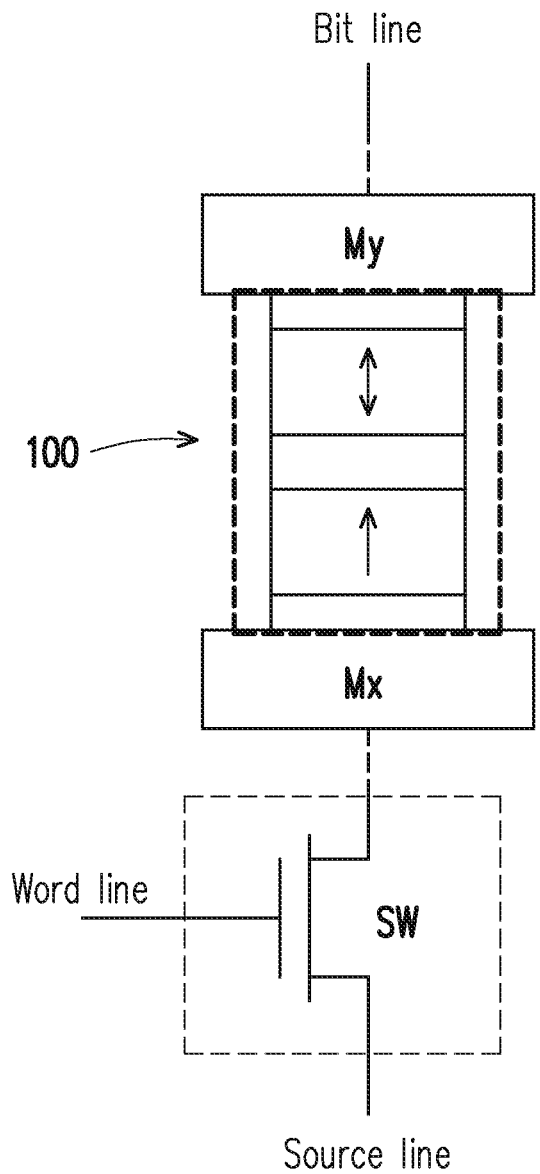
FIG. 1A is a schematic view of a MTJ MRAM cell according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

The MRAM cells include a film stack of multiple layers including magnetic layers. In some MRAM devices, depending on the magnetic design, one or more non-magnetic spacer layers may need to be inserted between magnetic layers to optimize the magnetic interaction. The film stack of the MRAM cells often suffers from an adverse diffusion problem, in which metal from a seed layer and/or a spacer layer diffuses into functional layers of the MTJ, causing adverse effects on the magnetic tunneling function. Depending on the severity of the diffusion issues in the film stack design, one or more diffusion barrier layers may need to be inserted into the film stack to minimize the adverse diffusion phenomenon. Further, in the MTJ MRAM cells, other than the tunneling barrier layer, every layer within the film stack needs to be conductive to maximize a read/write window.

Under these requirements, it is important to appropriately select a material for a seed layer, a spacer layer and/or a diffusion barrier layer, which can provide a desired specific crystalline structure and orientation, and does not disrupt the magnetic interactions of the functional layers. Further, the seed layer, the spacer layer and the diffusion barrier layer should be smooth, non-orientation specific (amorphous), conductive and non-magnetic.

The magnetic tunneling function of the MTJ MRAM cells depends on a specific crystalline structure and an orientation of the MTJ films. In order to have the desired crystalline structure and orientation in the MTJ films, the whole film stack needs to be grown on a smooth, amorphous, conductive, non-magnetic seed layer. Among various materials, tantalum (Ta) is the most widely used as the seed layer, which can be easily grown as a smooth and amorphous layer. However, Ta easily diffuses into the MTJ films, causing adverse effects on the magnetic tunneling functions. Further, a non-magnetic spacer layer, such as molybdenum (Mo), is often used in the MTJ films, but a Mo film also exhibits another diffusion problem.

Other than tantalum (Ta) and molybdenum (Mo), cobalt (Co), platinum (Pt) and/or nickel (Ni) may be used as a seed layer or a spacer layer, but they also diffuse into the tunneling barrier layer, which is a metal oxide layer (e.g., MgO), of the MTJ films. Moreover, Ta can react with oxygen inside the oxide layer, causing a change of the metal oxide crystalline structure and orientation from the desired state. The insertion of the diffused atoms into the MgO lattice also increase its stress, which could lead to degradation of the MgO lattice quality over thermal aging.

The crystalline magnetic layers are grown from the crystalline lattice of the MgO layer, or use it as a growth template. Thus, the diffusion of Ta, Mo, Co, Pt, Ni and other seed or spacer layer materials into the tunneling barrier layer of the MTJ also prevents the adjacent magnetic metal layers from reaching their desired crystalline structure and orientation.

In the present disclosure, in a memory cell of a magnetic random access memory, the memory cell includes a film stack of multiple layers, and at least one of the multiple layers includes iridium. More specifically, at least one of the seed layer, a spacer layer and a diffusion barrier layer includes iridium.

FIG. 1A is a schematic view of a MTJ MRAM cell according to an embodiment of the present disclosure. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. One of the terminals of the switching device SW is coupled to the lower metal layer Mx and the other terminal is coupled to the source line, which is a fixed potential (e.g., the ground) in some embodiments. The upper metal layer My is coupled to a bit line. In some embodiments, the switching device SW is disposed between the upper metal layer My and the bit line.

The MTJ film stack 100 includes a first electrode layer 110 coupled to the lower metal layer Mx and a second electrode layer 155 coupled to the upper metal layer My. An MTJ functional layer 101 is disposed between the first electrode layer 110 and the second electrode layer 155, as shown in FIG. 1B.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The free magnetic layer 140 is configured such that the magnetic orientation can be changed, or rotated, by exposure to an external magnetic field. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 is made of magnesium oxide (MgO) having a thickness in a range from about 0.5 nm to about 1.2 nm.

Figure 1B:
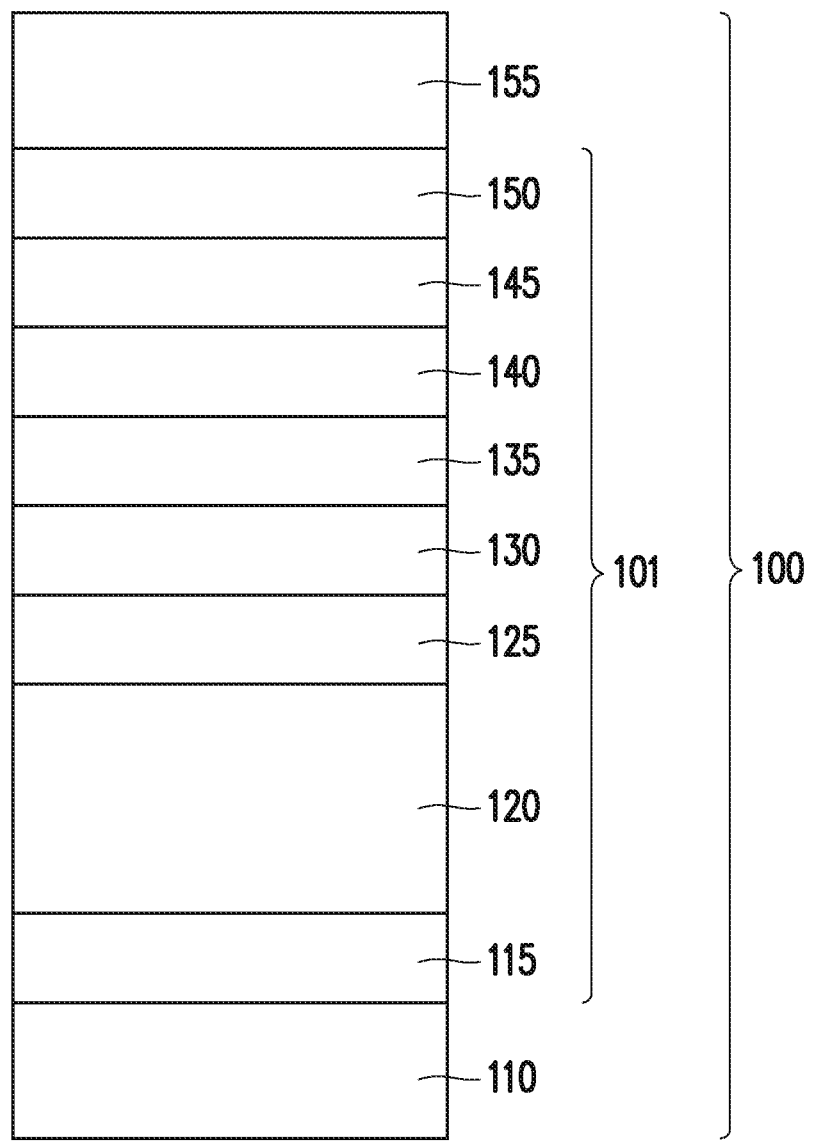
FIG. 1B is a schematic cross sectional view of the MTJ film stack according to an embodiment of the present disclosure.

The MTJ functional layer 101 further includes an antiferromagnetic layer 125, as shown in FIG. 1B. The antiferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 including one or more magnetic materials, as shown in FIG. 1B.

Figure 2A:
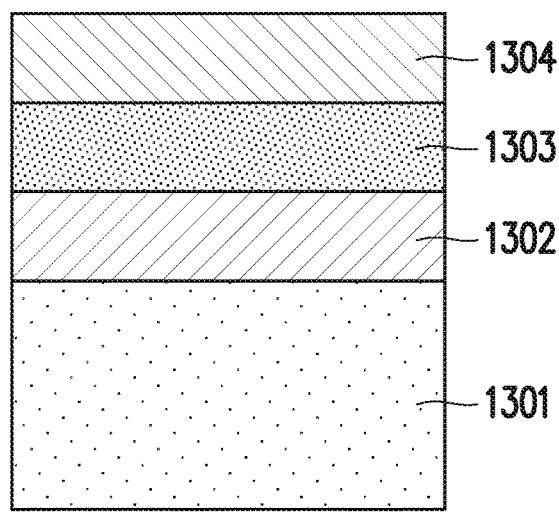
FIGS. 2A, 2B and 2C show schematic cross sectional views of magnetic layers of the MTJ film stack according to an embodiment of the present disclosure.

The second pinned magnetic layer 130 includes multiple layers of magnetic materials. In some embodiments, as shown in FIG. 2A, the second pinned magnetic layer 130 includes four layers 1301, 1302, 1303 and 1304, where the layer 1304 is in contact with the tunneling barrier layer 135 and the layer 1301 is in contact with the antiferromagnetic layer 125. In some embodiments, the layer 1301 (the bottommost layer) includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1301 is in a range from about 2.0 nm to about 5.0 nm in some embodiments. The layer 1302 includes a cobalt layer having a thickness in a range from about 0.4 nm to about 0.6 nm. In certain embodiments, the layer 1301 is the cobalt layer and the layer 1302 is the multilayer of the cobalt layers and the platinum layers as set forth above. In this disclosure, a "element" layer generally means that the content of the "element" is more than 99%.

The layer 1303 is a spacer layer. The thickness of the spacer layer 1303 is in a range from about 0.2 nm to about 0.5 nm in some embodiments. The layer 1304 is a cobalt iron boron (CoFeB) layer, a cobalt/palladium (CoPd) layer and/ or a cobalt iron (CoFe) layer.

The thickness of the layer 1304 is in a range from about 0.8 nm to about 1.5 nm in some embodiments.

Figure 2B:
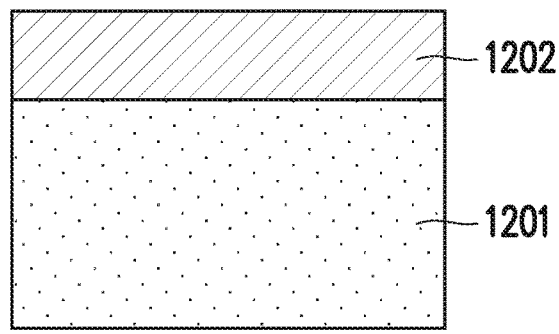

The first pinned magnetic layer 120 includes multiple layers of magnetic materials. In some embodiments, as shown in FIG. 2B, the first pinned magnetic layer 120 includes two layers 1201 and 1202, where the layer 1202 is in contact with the antiferromagnetic layer 125. In some embodiments, the layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm.

Figure 2C:
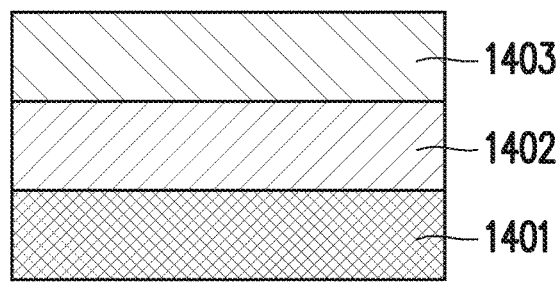

The free magnetic layer 140 includes a cobalt iron boron (CoFeB) layer, a cobalt/palladium (CoPd) layer and/or a cobalt iron (CoFe) layer having a thickness is in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the layer 1401 is in contact with the tunneling barrier layer 135. The layers 1401 and 1403 are a cobalt iron boron (CoFeB) layer, a cobalt/palladium (CoPd) layer and/or a cobalt iron (CoFe) layer having a thickness is in a range from about 1.0 nm to about 2.0 nm in some embodiments. The layer 1402 is a spacer layer. The thickness of the spacer layer 1402 is in a range from about 0.2 nm to about 0.6 nm in some embodiments.

The MTJ functional layer 101 further includes a seed layer 115 formed on the first electrode layer 110, a capping layer 145 formed on the free magnetic layer 140, a diffusion barrier layer 150 formed on the capping layer 145, as shown in FIG. 1B. The capping layer 145 is made of a dielectric material, such as magnesium oxide or aluminum oxide, and has a thickness in a range from about 0.5 nm to about 1.5 nm in some embodiments. The first electrode layer 110 is made of a conductive material, such as a metal, to reduce the resistance of the first pinned magnetic layer 120, especially for programming. The second electrode layer 155 is also made of a conductive material, such as a metal, to reduce the resistivity during reading.

In the present embodiments, at least one of the first electrode layer 110, the seed layer 115, the diffusion barrier layer 150, the second electrode layer 155, the spacer layer 1303 and the spacer layer 1402 includes iridium (Jr). In certain embodiments, at least one of the first electrode layer 110, the seed layer 115, the diffusion barrier layer 150 and the second electrode layer 155 includes iridium (Jr). The iridium containing layer can be one selected from the group consisting of an iridium layer, an iridium oxide layer, a bilayer structure of an iridium layer and an iridium oxide layer, an iridium-titanium nitride layer, a bilayer structure of an iridium layer and a tantalum layer, and a binary alloy layer of iridium and tantalum.

These iridium containing materials have unique features. For example, iridium and a binary alloy of iridium and tantalum have a natural tendency to form a super smooth surface morphology, have a very high electric conductivity and are non-magnetic. Further, iridium and a binary alloy of iridium and tantalum can be formed as an amorphous layer. In addition, iridium-tantalum sub-oxide is a conductor or a semiconductor, having a substantial conductivity. Iridium oxide is a conductive and dense material, and has a high diffusion barrier property even formed in a thin layer (e.g., less than 1.0 nm). Further, an iridium layer and/or an iridium oxide layer can be easily integrated into a semiconductor CMOS process. Further, the iridium containing materials generally have stable chemical and physical properties, are chemically inert and are corrosion resistive.

In some embodiments, the seed layer 115 includes an iridium layer and/or a binary alloy layer of iridium and tantalum. The seed layer 115 is for a growth of the first pinned magnetic layer 120, and is generally required to have a smooth surface morphology, a high electric conductivity and to be substantially free of diffusion into the pinned magnetic layer 120. The thickness of the seed layer 115 is in a range from about 0.5 nm to about 20 nm in some embodiments, and is in a range from about 1.0 nm to about 10 nm in other embodiments. The seed layer 115 is amorphous in some embodiments.

In some embodiments, the diffusion barrier layer 150 includes an iridium layer and/or a binary alloy layer of iridium and tantalum. A diffusion barrier layer for the MTJ film stack is generally required to have a super smooth surface morphology and a high electric conductivity and to be substantially effective in alleviating the diffusion issue. Further, the diffusion barrier layer should also be tolerant to a low level of oxidation without significant degradation of its conductivity. The thickness of the diffusion barrier layer 150 is in a range from about 0.1 nm to about 10 nm in some embodiments, and is in a range from about 0.5 nm to about 5.0 nm in other embodiments.

In some embodiments, the spacer layer 1303 and/or the spacer layer 1402 include an iridium layer and/or a binary alloy layer of iridium and tantalum. A spacer layer for the MTJ film stack is generally required to have a super smooth surface morphology and a high electric conductivity and to be substantially free from diffusion issue. Further, the spacer layer should also be tolerant to a low level of oxidation without significant degradation of its conductivity. The thickness of the spacer layers 1303 and/or 1402 is in a range from about 0.1 nm to about 10 nm in some embodiments, and is in a range from about 0.5 nm to about 5.0 nm in other embodiments.

In certain embodiments, one or more additional diffusion barrier layers and/or spacer layers including the aforementioned iridium containing layer can be inserted between any two adjacent layers among the first electrode layer 110, the seed layer 115, the first pinned magnetic layer 120, the antiferromagnetic layer 125, the second pinned magnetic layer 130, the tunneling barrier layer 135, the free magnetic layer 140, the capping layer 145, the diffusion barrier layer 150 and the second electrode layer 155.

Figure 3:
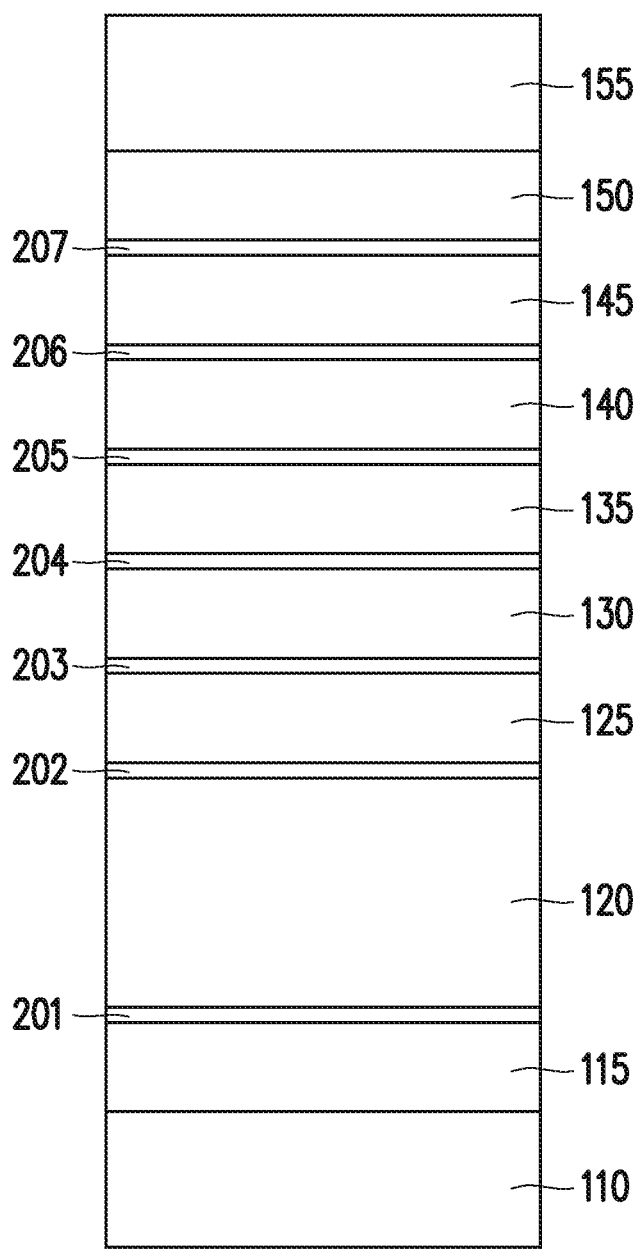
FIG. 3 is a schematic cross sectional view of the MTJ film stack according to another embodiment of the present disclosure.

For example, in some embodiments, as shown in FIG. 3, a spacer or a barrier layer 201 is inserted between the seed layer 115 and the first pinned magnetic layer 120. When the seed layer 115 is made of one or more of tantalum (Ta), molybdenum (Mo), cobalt (Co), nickel (Ni), ruthenium (Ru) and platinum (Pt), the spacer or barrier layer 201 can prevent diffusion of Ta, Mo, Co, Ni, Ru and/or Pt into the first pinned magnetic layer 120. In certain embodiments, the spacer or barrier layer 201 includes at least one selected from the group consisting of an iridium layer and a binary alloy layer of iridium and tantalum. The thickness of the spacer or barrier layer 201 is in a range from about 0.1 nm to about 10 nm in some embodiments, and is in a range from about 0.5 nm to about 5.0 nm in other embodiments. When the seed layer 115 includes an iridium containing layer, the spacer or barrier layer 201 may not be necessary.

In some embodiments, as shown in FIG. 3, a spacer or a barrier layer 204 is inserted between the second pinned magnetic layer 130 and the tunneling barrier layer 135. The spacer or barrier layer 204 can prevent diffusion of Co, Fe and/or Ta included in the second pinned magnetic layer 130 into the tunneling barrier layer 135. In certain embodiments, the spacer or barrier layer 204 includes at least one selected from the group consisting of an iridium layer and a binary alloy layer of iridium and tantalum. The thickness of the spacer or barrier layer 204 is in a range from about 0.1 nm to about 10 nm in some embodiments, and is in a range from about 0.5 nm to about 5.0 nm in other embodiments.

Similarly, in some embodiments, a spacer or a barrier layer 205 is inserted between the tunneling barrier layer 135 and the free magnetic layer 140. The spacer or barrier layer 205 can prevent diffusion of Co, Fe and/or Ta included in the free magnetic layer 140 into the tunneling barrier layer 135. In certain embodiments, the spacer or barrier layer 205 includes at least one selected from the group consisting of an iridium layer and a binary alloy layer of iridium and tantalum. The thickness of the spacer or barrier layer 205 is in a range from about 0.1 nm to about 10 nm in some embodiments, and is in a range from about 0.5 nm to about 5.0 nm in other embodiments.

In some embodiments, a spacer or a barrier layer 206 is inserted between the free magnetic layer 140 and the capping layer 145. In certain embodiments, the capping layer 145 is made of magnesium oxide or aluminum oxide. The spacer or barrier layer 206 can prevent diffusion of Co, Fe and/or Ta included in the free magnetic layer 140 into the capping layer 145. In certain embodiments, the spacer or barrier layer 206 includes at least one selected from the group consisting of an iridium layer and a binary alloy layer of iridium and tantalum. The thickness of the spacer or barrier layer 206 is in a range from about 0.1 nm to about 10 nm in some embodiments, and is in a range from about 0.5 nm to about 5.0 nm in other embodiments.

In some embodiments, a spacer or a barrier layer 207 is inserted between the capping layer 145 and the diffusion barrier layer 150. In certain embodiments, the diffusion barrier layer 150 is made of tantalum or other materials. The spacer or barrier layer 207 can prevent diffusion of Ta included in the diffusion barrier layer 150 into the capping layer 145. In certain embodiments, the spacer or barrier layer 207 includes at least one selected from the group consisting of an iridium layer and a binary alloy layer of iridium and tantalum. The thickness of the spacer or barrier layer 207 is in a range from about 0.1 nm to about 10 nm in some embodiments, and is in a range from about 0.5 nm to about 5.0 nm in other embodiments. When the diffusion barrier layer 150 includes an iridium containing layer, the spacer or barrier layer 207 may not be necessary.

In other embodiments, a spacer or a barrier layer 202 is inserted between the first pinned magnetic layer 120 and the antiferromagnetic layer 125, as shown in FIG. 3. In certain embodiments, the spacer or barrier layer 202 includes at least one selected from the group consisting of an iridium layer and a binary alloy layer of iridium and tantalum. The thickness of the spacer or barrier layer 202 is in a range from about 0.1 nm to about 10 nm in some embodiments, and is in a range from about 0.5 nm to about 5.0 nm in other embodiments.

In other embodiments, a spacer or a barrier layer 203 is inserted between the antiferromagnetic layer 125 and the second pinned magnetic layer 130, as shown in FIG. 3. In certain embodiments, the spacer or barrier layer 203 includes at least one selected from the group consisting of an iridium layer and a binary alloy layer of iridium and tantalum. The thickness of the spacer or barrier layer 203 is in a range from about 0.1 nm to about 10 nm in some embodiments, and is in a range from about 0.5 nm to about 5.0 nm in other embodiments.

The spacer or barrier layer 202 and 203 can further prevent diffusion of Ta, Mo, Co, Ni, Ru and/or Pt, which may be included in the first electrode layer 110, the seed layer 115, the first pinned magnetic layer 120 and/or the antiferromagnetic layer 125 into the tunneling barrier layer 135.

In some embodiments, at least one of the first electrode layer 110 and the second electrode layer 155 includes one selected from the group consisting of an iridium layer, an iridium oxide layer, a bilayer structure of an iridium layer and an iridium oxide layer, an iridium-titanium nitride layer, and a binary alloy layer of iridium and tantalum. The first electrode layer 110 is formed on the lower metal layer Mx made of, for example, Cu, Al, W, Co, Ni, and/or an alloy thereof, and the upper metal layer My made of, for example, Cu, Al, W, Co, Ni, and/or an alloy thereof, is formed on the second electrode layer 155. When the first electrode layer 110 and the second electrode layer 155 do not include an iridium containing layer, the first electrode layer 110 includes one or more of Ta, Pt, Au, Cr and TiN, and the second electrode layer 155 includes one or more of Ru, Au, Cr and Ta.

The iridium containing layers can be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes further comprising low pressure CVD (LPCVD), ultrahigh vacuum CVD (UHVCVD), reduced pressure CVD (RPCVD), or any combinations thereof, or any other suitable film deposition method. The pinned magnetic layer, the free magnetic layer and the antiferromagnetic layer can also be formed by CVD, PVD or ALD or any other suitable film deposition method. The tunneling barrier layer can also be formed by CVD, PVD or ALD or any other suitable film deposition method. The first and second electrode layers can also be formed by CVD, PVD, ALD, or electro plating, or any other suitable film deposition method.

In some embodiments, the first electrode layer 110 is formed on the lower metal layer Mx, which has been patterned, the seed layer 115 is formed on the first electrode layer 110, the first pinned magnetic layer 120 is formed on the seed layer 115, the antiferromagnetic layer 125 is formed on the first pinned magnetic layer 120, the second pinned magnetic layer 130 is formed on the antiferromagnetic layer 125, the tunneling barrier layer 135 is formed on the second pinned magnetic layer 130, the free magnetic layer 140 is formed on the tunneling barrier layer 135, the capping layer 145 is formed on the free magnetic layer 140, the diffusion barrier layer 150 is formed on the capping layer 145, and the second electrode layer 155 is formed on the diffusion layer 150. One or more lithography and etching operations are performed to pattern the stacked layer into the MTJ film stack for each memory cell. In other embodiments, trenches for memory cells are formed in a dielectric layer and the MTJ film is formed in the trenches.

In some embodiments, the MRAM cells are formed over a dielectric material disposed over the substrate. In some embodiments, the substrate includes silicon (Si) or other suitable semiconductor material. Transistors, driver circuits, logic circuits or any other electronic devices are formed by semiconductor materials and integrated with the MRAM cells.

FIGS. 4A-4D show a memory operation of MTJ cell. As shown in FIGS. 4A-4D, the MTJ cell includes a pinned magnetic layer 10, a tunneling barrier layer 15 and a free magnetic layer 20. The pinned magnetic layer 10 corresponds to the second pinned magnetic layer 130 or the combination of the first pinned magnetic layer 120, the antiferromagnetic layer 125 and the second pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 4A-4D, the remaining layers are omitted. A current source 30 is coupled to the MTJ structure in series.

Figure 4A:
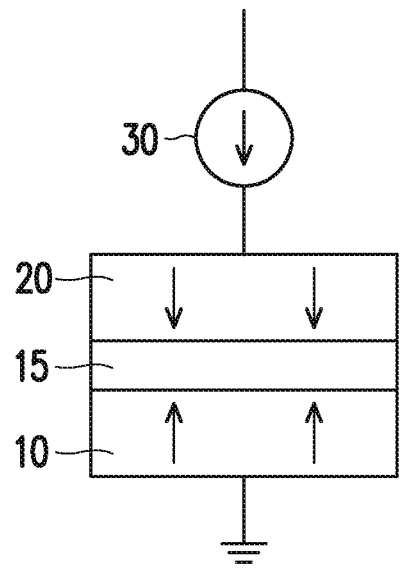
FIGS. 4A and 4B show a memory operation of MTJ cell.
Figure 4B:
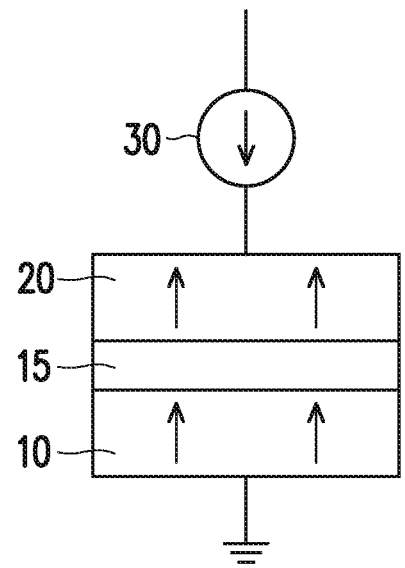
Figure 4C:
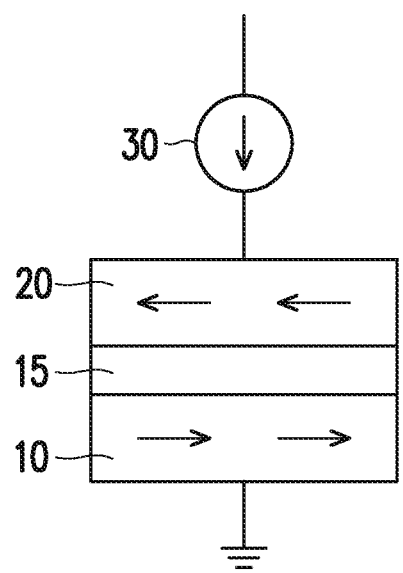
FIGS. 4C and 4D show a memory operation of MTJ cell.
Figure 4D:
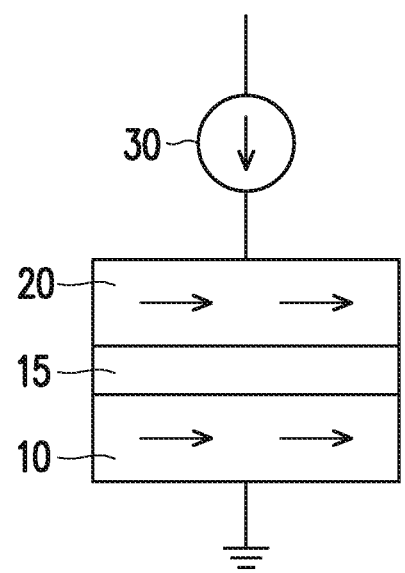

In FIG. 4A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 4B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 4C and 4D. In FIG. 4C, the pinned magnetic layer 10 and the free magnetic layer 20 are magnetically oriented in opposite directions, while in FIG. 4D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 4A (or FIG. 4C) is larger than the cell voltage $V_2$ in the case of FIG. 4B (or FIG. 4D), because the resistance of an opposite-oriented MTJ cell shown in FIG. 4A (or FIG. 4C) is greater than the resistance of a same-oriented MTJ cell shown in FIG. 4B (or FIG. 4D). Binary logic data ("0" and "1") can be stored in a MTJ cell and retrieved based on the cell orientation and resulting resistance. Further, since the stored data does not require a storage energy source, the cell is non-volatile.

Figure 5:
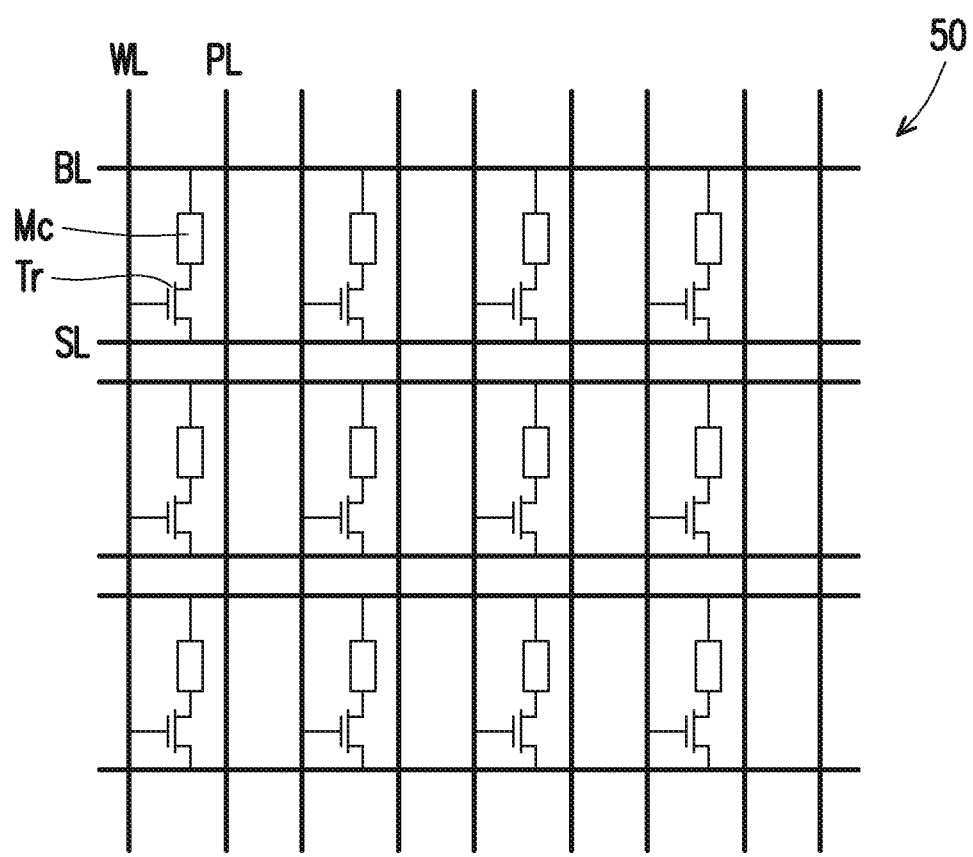
FIG. 5 shows an MRAM array.

FIG. 5 shows an MRAM array 50. Each memory cell includes a MTJ cell Mc and a transistor Tr, such as a MOS FET. The gate of the transistor Tr is coupled to a word line WL and a drain (or a source) of the transistor Tr is coupled to one end of the MTJ cell Mc, and another end of the MTJ cell is coupled to a bit line BL. Further, a signal line PL for programming is provided adjacent to the MTJ cells.

A memory cell is read by asserting the word line of that cell, forcing a reading current through the bit line BL of that cell, and then measuring the voltage on that bit line BL. For example, to read the state of a target MTJ cell, the word line WL is asserted to turn ON the transistor Tr. The free magnetic layer of the target MTJ cell is thereby coupled to the fixed potential SL, e.g., the ground through the transistor Tr. Next, the reading current is forced on the bit line BL. Since only the given reading transistor Tr is turned ON, the reading current flows through the target MTJ cell to the ground. The voltage of the bit line BL then measured to determine the state ("0" or "1") of the target MTJ cell. In some embodiments, as shown in FIG. 5, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

FIGS. 6A-9B show various stages of a sequential manufacturing process of the semiconductor device including an MRAM according to an embodiment of the present disclosure. It is understood that additional operations can be provided before, during, and after processes shown by FIGS. 6A-9B, and some of the operations described below can be replaced or eliminated, for additional embodiments of the method. Material, configuration, dimensions and/or processes the same as or similar to the foregoing embodiments described with FIGS. 1A-5 may be employed in the following embodiments, and detailed explanation thereof may be omitted.

Figure 6A:
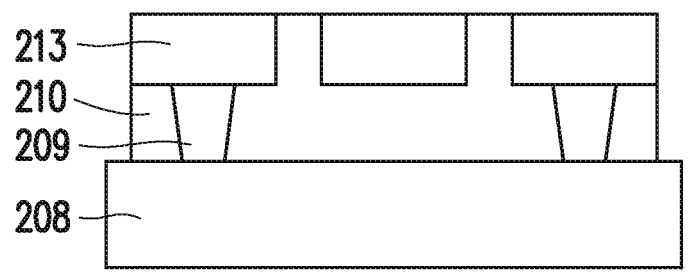
FIGS. 6A, 6B and 6C show various stages of a sequential manufacturing process of the semiconductor device including an MRAM according to an embodiment of the present disclosure.
Figure 6B:
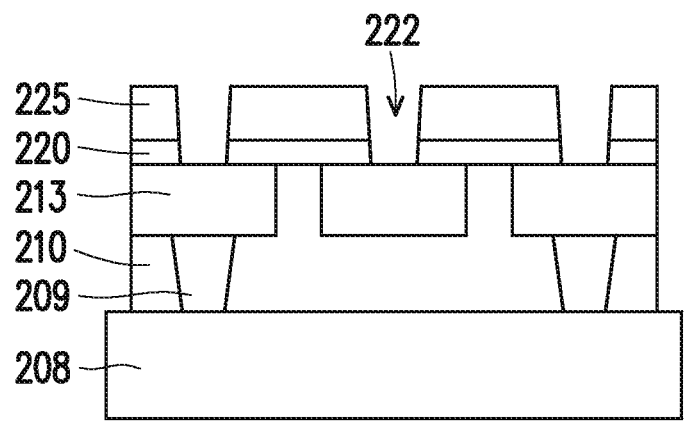
Figure 6C:
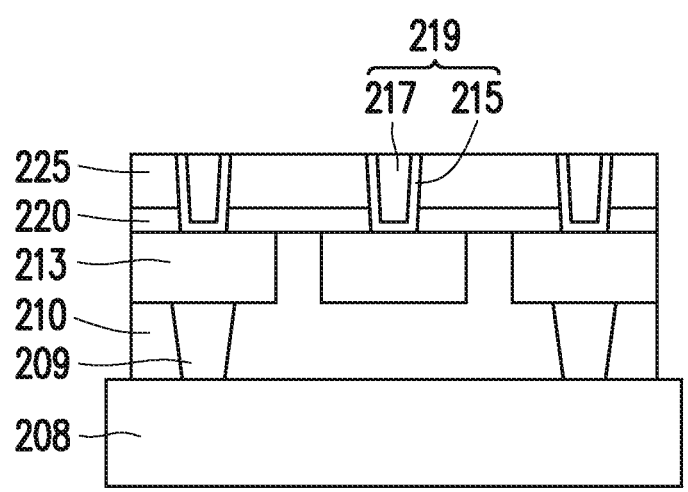

As shown in FIG. 6A, lower metal wirings 213 are formed in the first ILD layer 210 over the substrate 208. In some embodiments, via contacts 209 are provided under the lower metal wirings 213. Then, as shown in FIG. 6B, a first insulating layer as an etch stop layer 220 is formed over the structure of FIG. 6A, and a second ILD layer 225 is formed over the first insulating layer 220. Further, as shown in FIG. 6B, via contact openings 222 are formed to expose the upper surface of the lower metal wirings 213, by using one or more lithography and etching operations. Subsequently, via contact 219 including layers 215 and 217 are formed, as shown in FIG. 6C. One or more film forming operations, such as CVD, PVD including sputtering, ALD, electro-chemical plating and/or electro-plating, are performed, and a planarization operation, such as CMP, is performed to fabricate the via contacts 219.

Figure 7A:
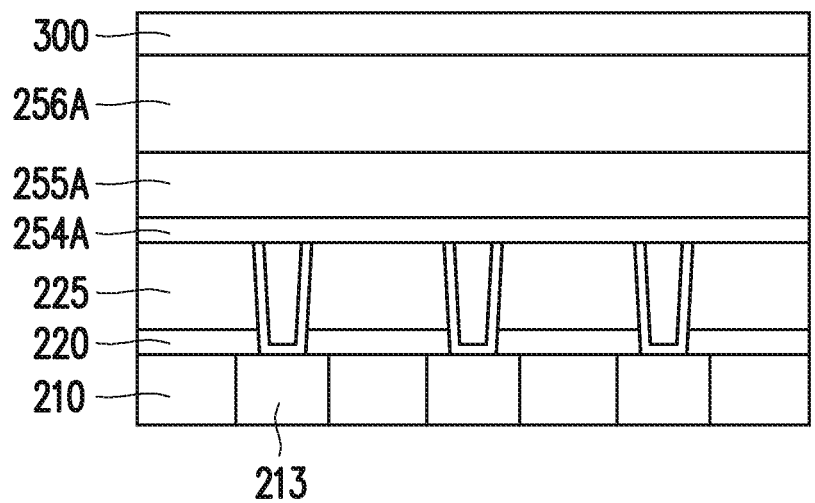
FIGS. 7A and 7B show various stages of a sequential manufacturing process of the semiconductor device including an MRAM according to an embodiment of the present disclosure.

Then, as shown in FIG. 7A, a first conductive layer 254A for the bottom electrode 254, a stacked layer 255A for the MTJ film stack 255 and a second conductive layer 256A for the top electrode 256 are sequentially formed. In some embodiments, a layer 300 for a hard mask is further formed on the second conductive layer 256A.

As set forth above, the first conductive layer 245A and/or one or more layers of the stacked layer 255A for the MTJ film stack 255 include one of an iridium layer, a bilayer structure of an iridium layer and an iridium oxide layer, an iridium-titanium nitride layer, a bilayer structure of an iridium layer and a tantalum layer, and a binary alloy layer of iridium and tantalum. The layers 254A, 255A and 256A can be formed by physical vapor deposition (PVD) including sputtering, molecular beam epitaxy (MBE), pulsed laser deposition (PLD), atomic layer deposition (ALD), electron beam (e-beam) epitaxy, chemical vapor deposition (CVD), or derivative CVD processes further comprising low pressure CVD (LPCVD), ultrahigh vacuum CVD (UHVCVD), reduced pressure CVD (RPCVD), electro plating, or any combinations thereof, or any other suitable film deposition method.

Figure 7B:
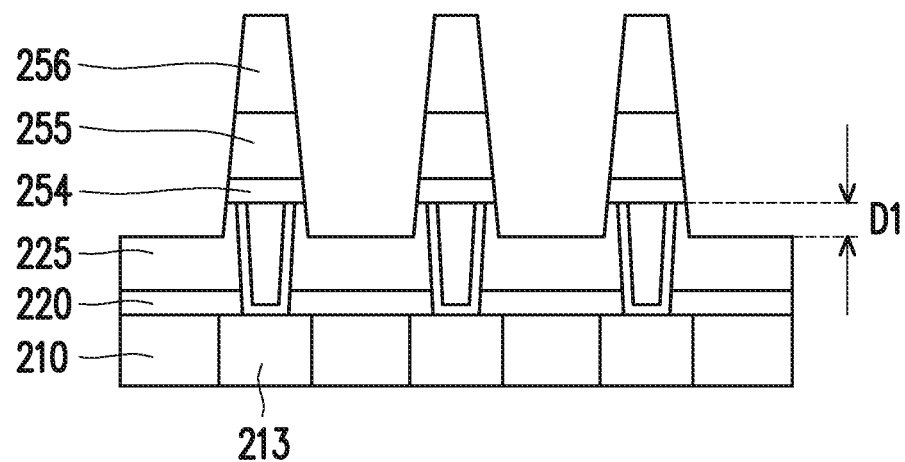

By using one or more lithography and etching operations, the film stack shown in FIG. 7A is patterned into an MRAM cell structure including the bottom electrode 254, the MTJ film stack 255 and the top electrode 256, as shown in FIG. 7B. In some embodiments, after the patterning the second conductive layer 256A, the stacked layer 255A and the first conductive layer 256A, the second ILD layer 225 is partially recessed. The amount D1 of the recess is in a range from about 1 nm to about 30 nm in some embodiments.

Figure 8A:
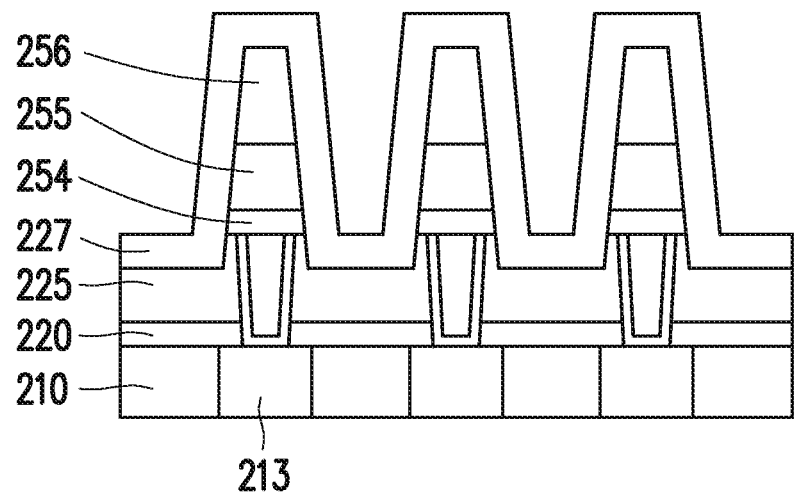
FIGS. 8A and 8B show various stages of a sequential manufacturing process of the semiconductor device including an MRAM according to an embodiment of the present disclosure.

Subsequently, as shown in FIG. 8A, a sidewall spacer layer 227 is formed to cover the MRAM cell structure. The sidewall spacer layer 227 can be formed by CVD, PVD or ALD or any other suitable film deposition method. In some embodiments, the sidewall spacer layer 227 is formed by CVD, PVD or ALD at a lower temperature range less than about 150° C., such as a range from about 100° C. to about 150° C. When the sidewall spacer layer 227 is formed at a higher temperature, such as a range from about 200° C. to about 300° C. (or more), the film formation process may cause damage to the MTJ film stack 255. As shown in FIG. 8A, the sidewall spacer layer 227 is conformally formed. In some embodiments, the sidewall spacer layer 227 includes multiple layers of different insulating materials.

Figure 8B:
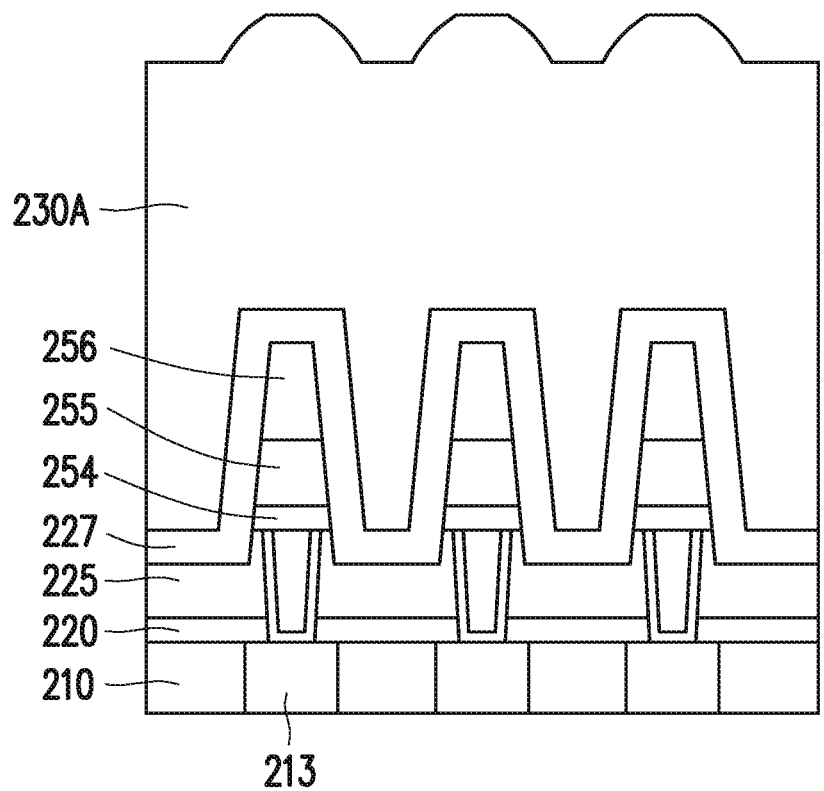

Next, as shown in FIG. 8B, a dielectric material layer 230A for the third ILD layer 230 is formed to fully cover the sidewall spacer layer 227. In some embodiments, as a planarization operation, an etch-back operation is performed on the dielectric material layer 230A, and then a CMP operation is performed.

Figure 9A:
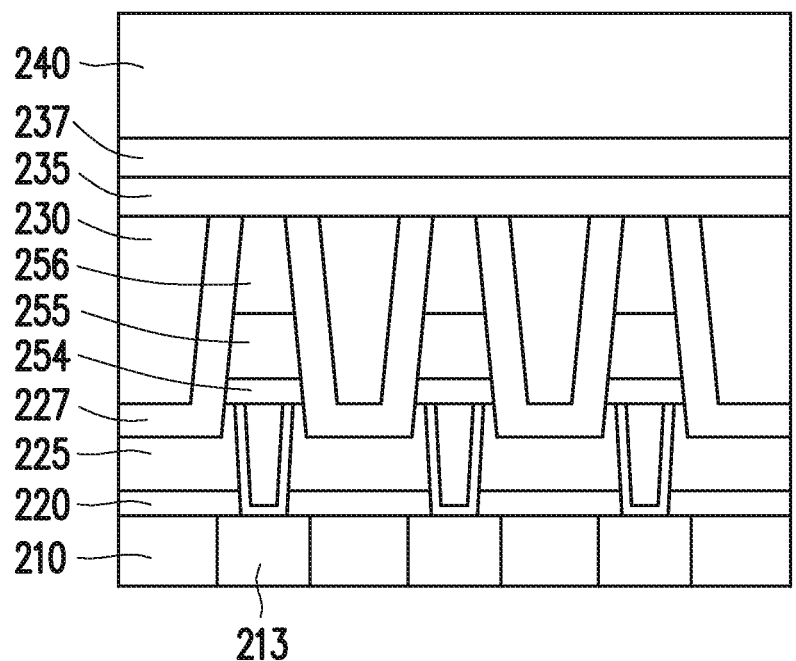
FIGS. 9A and 9B show various stages of a sequential manufacturing process of the semiconductor device including an MRAM according to an embodiment of the present disclosure.

Subsequently, as shown in FIG. 9A, a fourth ILD layer including a first dielectric layer 235, a second dielectric layer 237 and a third dielectric layer 240 is formed after the planarization operation. The dielectric layers of the fourth ILD layer can be formed by CVD, PVD or ALD or other suitable film formation method. In some embodiments, the third dielectric layer 240 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Figure 9B:
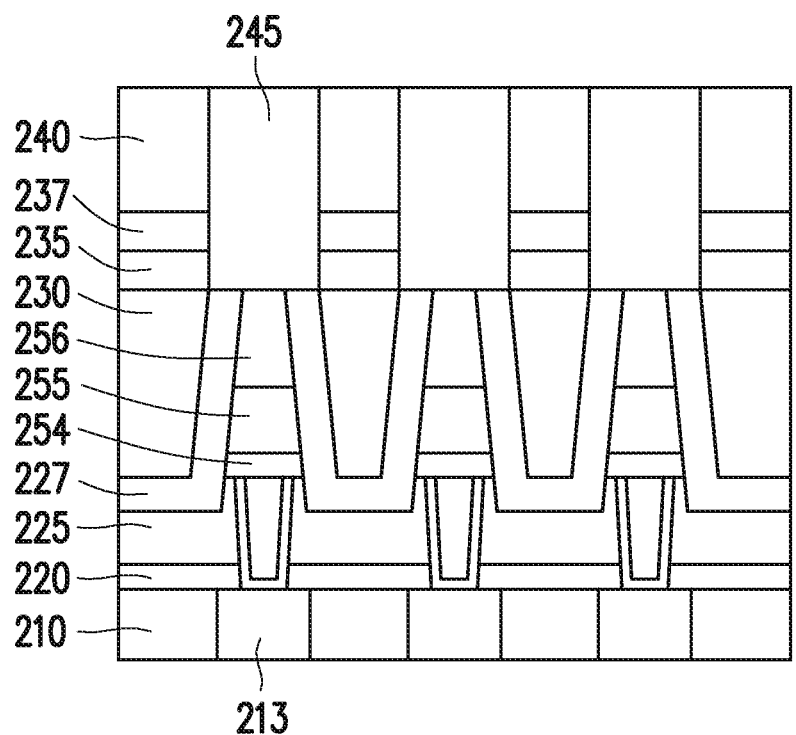

Then, as shown in FIG. 9B, contact openings are formed by using one or more lithography and etching operations, and the contact openings are filled with a conductive material so as to form conductive contacts 245 contacting the exposed top electrode 256.

It is understood that the device shown in FIG. 9B undergoes further semiconductor processes to form various features such as interconnect metal layers, dielectric layers, passivation layers, etc.

It will be understood that not all advantages have been necessarily discussed herein, no particular advantage is required for all embodiments or examples, and other embodiments or examples may offer different advantages.

For example, in the present disclosure, since one or more iridium containing layers is used or inserted in a magnetic tunneling junction MRAM cell, it is possible to prevent diffusion of metallic elements from a seed layer, a pinned magnetic layer, a free magnetic layer, an antiferromagnetic layer, and/or an electrode layer into an tunneling barrier layer. Further, since an iridium containing layer has a smooth surface morphology, the iridium containing seed layer can improve properties of a pinned magnetic layer formed thereon.

In accordance with an aspect of the present disclosure, a memory cell of a magnetic random access memory includes multiple layers disposed between a first metal layer and a second metal layer. At least one of the multiple layers include one selected from the group consisting of an iridium layer, a bilayer structure of an iridium layer and an iridium oxide layer, an iridium-titanium nitride layer, a bilayer structure of an iridium layer and a tantalum layer, and a binary alloy layer of iridium and tantalum. In one or more of the foregoing and following embodiments, the multiple layers include a first electrode layer made of a first conductive material and a second electrode layer made of a second conductive layer, between which remaining layers of the multiple layers are disposed. In one or more of the foregoing and following embodiments, at least one of the first electrode and the second electrode layers includes iridium. In one or more of the foregoing and following embodiments, at least one of the first electrode and the second electrode layers includes at least one selected from the group consisting of a bilayer structure of an iridium layer and an iridium oxide layer, an iridium-titanium nitride layer, a bilayer structure of an iridium layer and a tantalum layer, and a binary alloy layer of iridium and tantalum. In one or more of the foregoing and following embodiments, the multiple layers include a seed layer disposed over the first electrode layer, and the seed layer includes at least one selected from the group consisting of an iridium layer, a bilayer structure of an iridium layer and a tantalum layer, and a binary alloy layer of iridium and tantalum. In one or more of the foregoing and following embodiments, the multiple layers include a pinned magnetic layer disposed over the seed layer, a tunneling barrier layer made of a non-magnetic material and disposed over the pinned magnetic layer, a free magnetic layer disposed over the tunneling barrier layer, and a diffusion barrier layer disposed over the free magnetic layer, and the diffusion barrier layer includes at least one selected from the group consisting of an iridium layer, a bilayer structure of an iridium layer and a tantalum layer, and a binary alloy layer of iridium and tantalum. In one or more of the foregoing and following embodiments, the pinned magnetic layer includes a first magnetic layer and a second magnetic layer and an antiferromagnetic layer disposed between the first and second magnetic layers. In one or more of the foregoing and following embodiments, the multiple layers further includes a capping layer made of a non-magnetic material and disposed between the free magnetic layer and the diffusion barrier layer. In one or more of the foregoing and following embodiments, the tunneling barrier layer and the capping layer are made of magnesium oxide.

In accordance with another aspect of the present disclosure, a memory cell of a magnetic random access memory includes multiple layers. The multiple layers include a first electrode layer, a seed layer disposed over the first electrode layer, a first pinned magnetic layer disposed over the seed layer, an antiferromagnetic layer disposed over the first pinned magnetic layer, a second pinned magnetic layer disposed over the antiferromagnetic layer, a tunneling barrier layer made of a non-magnetic material and disposed over the second pinned magnetic layer, a free magnetic layer disposed over the tunneling barrier layer, a capping layer made of a non-magnetic material and disposed over the free magnetic layer, a diffusion barrier layer disposed over the capping layer, and a second electrode layer disposed over the diffusion layer. At least one iridium containing layer including iridium is disposed between any adjacent two layers from the seed layer to the diffusion barrier layer. In one or more of the foregoing and following embodiments, the at least one iridium containing layer has a thickness in a range from 0.1 nm to 5.0 nm. In one or more of the foregoing and following embodiments, no layer from the seed layer to the diffusion barrier layer contains iridium.

In accordance with another aspect of the present disclosure, a semiconductor device includes a magnetic random access memory (MRAM) having a plurality of magnetic memory cells. Each of the magnetic memory cells comprising multiple layers disposed between a first metal layer and a second metal layer. At least one of the multiple layers include one selected from the group consisting of an iridium layer, a bilayer structure of an iridium layer and an iridium oxide layer, an iridium-titanium nitride layer, a bilayer structure of an iridium layer and a tantalum layer and a binary alloy layer of iridium and tantalum. In one or more of the foregoing and following embodiments, the multiple layers include a first electrode layer made of a first conductive material and a second electrode layer made of a second conductive layer, between which remaining layers of the multiple layers are disposed, and at least one of the first electrode and the second electrode layers includes at least one selected from the group consisting of an iridium layer, a bilayer structure of an iridium layer and an iridium oxide layer, an iridium-titanium nitride layer, a bilayer structure of an iridium layer and a tantalum layer, and a binary alloy layer of iridium and tantalum. In one or more of the foregoing and following embodiments, the multiple layers include a first electrode layer made of a first conductive material and a second electrode layer made of a second conductive layer, between which remaining layers of the multiple layers are disposed, the remaining layers includes a seed layer disposed over the first electrode layer, and the seed layer includes at least one selected from the group consisting of an iridium layer, a bilayer structure of an iridium layer and a tantalum layer, and a binary alloy layer of iridium and tantalum. In one or more of the foregoing and following embodiments, the multiple layers include a first electrode layer made of a first conductive material and a second electrode layer made of a second conductive layer, between which remaining layers of the multiple layers are disposed, the remaining layers includes a seed layer disposed over the first electrode layer and a pinned magnetic layer disposed over the seed layer, a tunneling barrier layer disposed over the pinned magnetic layer, a free magnetic layer disposed over the tunneling barrier layer, and a diffusion barrier layer disposed over the free magnetic layer, and the diffusion barrier layer includes at least one selected from the group consisting of an iridium layer, a bilayer structure of an iridium layer and a tantalum layer, and a binary alloy layer of iridium and tantalum. In one or more of the foregoing and following embodiments, the pinned magnetic layer includes a first magnetic layer and a second magnetic layer and an antiferromagnetic layer disposed between the first and second magnetic layers. In one or more of the foregoing and following embodiments, the multiple layers further includes a capping layer disposed between the free magnetic layer and the diffusion barrier layer. In one or more of the foregoing and following embodiments, the multiple layers include a first electrode layer, a seed layer disposed over the first electrode layer, a first pinned magnetic layer disposed over the seed layer, an antiferromagnetic layer disposed over the first pinned magnetic layer, a second pinned magnetic layer disposed over the antiferromagnetic layer, a tunneling barrier layer made of a non-magnetic material and disposed over the second pinned magnetic layer, a free magnetic layer disposed over the tunneling barrier layer, a capping layer made of a non-magnetic material and disposed over the free magnetic layer, a diffusion barrier layer disposed over the capping layer, and a second electrode layer disposed over the diffusion layer, and at least one iridium containing layer including iridium is disposed between any adjacent two layers from the seed layer to the diffusion barrier layer.

In accordance with another aspect of the present disclosure, in a method of manufacturing a magnetic random access memory, a first electrode layer is formed. A seed layer is formed over the first electrode layer. A pinned magnetic layer is formed over the seed layer. A tunneling barrier layer is formed over the pinned magnetic layer. A free magnetic layer is formed over the tunneling barrier. A capping layer is formed over the free magnetic layer. A diffusion barrier layer is formed over the capping layer. A second electrode layer is formed over the diffusion barrier layer. At least one of the first electrode layer, the seed layer, the diffusion barrier layer and the second electrode layer includes one selected from the group consisting of an iridium layer, a bilayer structure of an iridium layer and an iridium oxide layer, an iridium-titanium nitride layer, a bilayer structure of an iridium layer and a tantalum layer, and a binary alloy layer of iridium and tantalum.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell of a magnetic random access memory, the memory cell comprising multiple layers disposed between a first metal layer and a second metal layer, wherein:
   the multiple layers include:
      a first electrode layer,
      a seed layer disposed over the first electrode layer,
      a first pinned magnetic layer disposed over the seed layer,
      an antiferromagnetic layer disposed over the first pinned magnetic layer,
      a second pinned magnetic layer disposed over the antiferromagnetic layer,
      a tunneling barrier layer made of a non-magnetic material and disposed over the second pinned magnetic layer,
      a free magnetic layer disposed over the tunneling barrier layer,
      a capping layer made of a non-magnetic material and disposed over the free magnetic layer,
      a diffusion barrier layer disposed over the capping layer, and
      a second electrode layer disposed over the diffusion layer, and
   at least one iridium containing layer including iridium is disposed between any adjacent two layers from the seed layer to the diffusion barrier layer.

2. The memory cell of claim 1, wherein the at least one iridium containing layer is one selected from the group consisting of a iridium layer, a bilayer structure of a iridium layer and an iridium oxide layer, an iridium-titanium nitride layer, a bilayer structure of an iridium layer and a tantalum layer, and an binary alloy layer of iridium and tantalum.

3. The memory cell of claim 1, wherein the at least one iridium containing layer has a thickness in a range from 0.1 nm to 5.0 nm.

4. The memory cell of claim 1, wherein none of the seed layer, the first pinned magnetic layer disposed over the seed layer, the antiferromagnetic layer, the second pinned magnetic layer, the tunneling barrier layer, the free magnetic layer, the capping layer, the diffusion barrier layer and the second electrode layer contains iridium.

5. The memory cell of claim 1, wherein the seed layer is made of one selected from the group consisting of tantalum (Ta), molybdenum (Mo), cobalt (Co), platinum (Pt) and nickel (Ni).

6. The memory cell of claim 1, wherein the at least one iridium containing layer is one selected from the group consisting of an iridium-titanium nitride layer, and a bilayer structure of an iridium layer and a tantalum layer.

7. The memory cell of claim 1, wherein the at least one iridium containing layer is an iridium layer.

8. The memory cell of claim 1, wherein the tunneling barrier layer and the capping layer are made of magnesium oxide.

9. A semiconductor device including a magnetic random access memory (MRAM) having a plurality of magnetic memory cells, wherein:
   each of the magnetic memory cells comprises multiple layers disposed between a first metal layer and a second metal layer,
   the multiple layers include:
      a first electrode layer,
      a seed layer disposed over the first electrode layer, a first pinned magnetic layer disposed over the seed layer, an antiferromagnetic layer disposed over the first pinned magnetic layer, a second pinned magnetic layer disposed over the antiferromagnetic layer, a tunneling barrier layer made of a non-magnetic material and disposed over the second pinned magnetic layer, a free magnetic layer disposed over the tunneling barrier layer, a capping layer made of a non-magnetic material and disposed over the free magnetic layer, a diffusion barrier layer disposed over the capping layer, and a second electrode layer disposed over the diffusion layer, and at least one iridium containing layer including iridium is disposed between any adjacent two layers from the seed layer to the diffusion barrier layer.

10. The memory cell of claim 9, wherein the at least one iridium containing layer is one selected from the group consisting of a iridium layer, a bilayer structure of a iridium layer and an iridium oxide layer, an iridium-titanium nitride layer, a bilayer structure of an iridium layer and a tantalum layer, and an binary alloy layer of iridium and tantalum.

11. The memory cell of claim 9, wherein the at least one iridium containing layer has a thickness in a range from 0.1 nm to 5.0 nm.

12. The memory cell of claim 9, wherein none of the seed layer, the first pinned magnetic layer disposed over the seed layer, the antiferromagnetic layer, the second pinned magnetic layer, the tunneling barrier layer, the free magnetic layer, the capping layer, the diffusion barrier layer and the second electrode layer contains iridium.

13. The memory cell of claim 9, wherein the seed layer is made of one selected from the group consisting of tantalum (Ta), molybdenum (Mo), cobalt (Co), platinum (Pt) and nickel (Ni).

14. The memory cell of claim 9, wherein the at least one iridium containing layer is one selected from the group consisting of an iridium-titanium nitride layer, and a bilayer structure of an iridium layer and a tantalum layer.

15. The memory cell of claim 9, wherein the at least one iridium containing layer is an iridium layer.

16. The memory cell of claim 9, wherein the tunneling barrier layer and the capping layer are made of magnesium oxide.

17. A semiconductor device including a magnetic random access memory (MRAM) having a plurality of magnetic memory cells, wherein:

each of the magnetic memory cells comprises a MRAM stack disposed between a bottom electrode and a top electrode, the bottom electrode is embedded in a first interlayer dielectric layer, a side face the MRAM stack is covered by an insulating cover layer, the insulating cover layer is covered by a second ILD layer, the top electrode is embedded in a third ILD layer, the MRAM stack includes:

a first electrode layer, a seed layer disposed over the first electrode layer, a first pinned magnetic layer disposed over the seed layer, an antiferromagnetic layer disposed over the first pinned magnetic layer, a second pinned magnetic layer disposed over the antiferromagnetic layer, a tunneling barrier layer made of a non-magnetic material and disposed over the second pinned magnetic layer, a free magnetic layer disposed over the tunneling barrier layer, a capping layer made of a non-magnetic material and disposed over the free magnetic layer, a diffusion barrier layer disposed over the capping layer, and a second electrode layer disposed over the diffusion layer, and at least one iridium containing layer including iridium is disposed between any adjacent two layers from the seed layer to the diffusion barrier layer.

18. The semiconductor device of claim 17, wherein the MRAM stack has a tapered shape.

19. The semiconductor device of claim 17, wherein a part of the first ILD layer is recessed to form a step.

20. The semiconductor device of claim 19, wherein a depth of the step is in a range from 1 nm to 30 nm.

\* \* \* \* \*